(12) United States Patent
Gorisse et al.

(10) Patent No.: US 9,325,293 B2
(45) Date of Patent: Apr. 26, 2016

(54) LATERALLY COUPLED BAW FILTER EMPLOYING PHONONIC CRYSTALS

(75) Inventors: Marie Gorisse, Chauray (FR); Alexandre Reinhardt, Saint Martin d'Heres (FR)

(73) Assignee: Energies Alternatives, Paris (FR)

( * ) Notice: Subject to any disclaimer, the term of this patent is extended or adjusted under 35 U.S.C. 154(b) by 337 days.

(21) Appl. No.: 13/879,406

(22) PCT Filed: Oct. 10, 2011

(86) PCT No.: PCT/EP2011/067654
§ 371 (c)(1),
(2), (4) Date: May 6, 2013

(87) PCT Pub. No.: WO2012/049126
PCT Pub. Date: Apr. 19, 2012

(65) Prior Publication Data
US 2013/0214879 A1    Aug. 22, 2013

(30) Foreign Application Priority Data
Oct. 15, 2010    (FR) .................................... 10 58403

(51) Int. Cl.
*H03H 9/56* (2006.01)
*H03H 9/02* (2006.01)

(52) U.S. Cl.
CPC ........... *H03H 9/564* (2013.01); *H03H 9/02086* (2013.01); *H03H 9/56* (2013.01)

(58) Field of Classification Search
CPC ....... H03H 9/02086; H03H 9/56; H03H 9/54; H03H 9/564

USPC ................ 333/133, 186, 187, 189, 190, 191; 310/312, 320
See application file for complete search history.

(56) References Cited

U.S. PATENT DOCUMENTS

| | | | |
|---|---|---|---|
| 3,573,672 A | 4/1971 | Fair et al. | |
| 5,495,135 A | 2/1996 | Zimnicki et al. | |
| 6,492,759 B1 | 12/2002 | Watanabe | |

(Continued)

FOREIGN PATENT DOCUMENTS

EP    1 528 675 A1    4/2005

OTHER PUBLICATIONS

Billard, C. et al., "200mm Manufacturing Solution for Coupled Resonator Filters," Proceedings of the 39th European Solid-State Device Research Conference (ESSDERC 2009), pp. 133-136.

(Continued)

*Primary Examiner* — Benny Lee
*Assistant Examiner* — Jorge Salazar, Jr.
(74) *Attorney, Agent, or Firm* — Baker Hostetler LLP

(57) ABSTRACT

An acoustic wave bandpass filter comprises at least two bulk acoustic wave resonators, laterally coupled to each other acoustically, each resonator including a film of piezoelectric material and at least a first electrode and/or a second electrode, said bulk waves propagating in a direction perpendicular to the plane of the film of piezoelectric material, characterized in that: it further comprises at least a first phononic crystal structure between said resonators such that the transmission coefficient of the lateral acoustic waves can be decreased in a direction parallel to the plane of the piezoelectric film; and the first phononic crystal structure is formed in a matrix of dielectric material or with patterns made from dielectric material.

16 Claims, 10 Drawing Sheets

(56) References Cited

U.S. PATENT DOCUMENTS

| | | |
|---|---|---|
| 6,946,928 B2 | 9/2005 | Larson, III et al. |
| 7,939,987 B1* | 5/2011 | Solal et al. ............... 310/313 R |
| 2002/0079986 A1* | 6/2002 | Ruby et al. .................. 333/187 |
| 2005/0140465 A1 | 6/2005 | Hwu |
| 2006/0103492 A1* | 5/2006 | Feng et al. .................. 333/187 |
| 2011/0210802 A1* | 9/2011 | Ballandras et al. ........... 331/158 |

OTHER PUBLICATIONS

Fattinger, G. G. et al., "Optimization of Acoustic Dispersion for High Performance Thin Film BAW Resonators," 2005 IEEE Ultrasonics Symposium Proceedings (2005), pp. 1175-1178.

Fattinger, G. G. et al., "Single-to-balanced Filters for Mobile Phones using Coupled Resonator BAW Technology," 2004 IEEE International Ultrasonics Symposium (2004), pp. 416-419.

Jackel, J. L. et al., "Proton exchange for high-index waveguides in LiNbO3," Appl. Phys. Lett. vol. 41, No. 7, (1982), pp. 607-608.

Kuo, N.-K. et al., "Demonstration of Inverse Acoustic Band Gap Structures in AlN and Integration with Piezoelectric Contour Mode Transducers," 2009 IEEE Solid-State Sensors, Actuators and Microsystems Symposium (2009), pp. 2334-2337.

Laude, V. et al., "Band structure of evanescent waves in phononic crystals," 2008 IEEE Ultrasonics Symposium Proceedings (2008), pp. 249-252.

Meltaus, J. et al., "Laterally coupled solidly mounted BAW resonators at 1.9 GHz," 2009 Ultrasonics Symposium Proceedings (2009), 4 pages.

Kiyoshi Nakamura, et al., "Thin Film Resonators and Filters", International Symposium on Acoustic Wave Devices for Futuremobile Communication Systems, Mar. 5, 2001, pp. 93-99, XP008048920.

R.H. Olsson, III, et al., "Topical Review: Microfabricated Phononic Crystal Devices and Applications", Measurement Science and Technology, Jan. 1, 2009, vol. 20, No. 1, XP020152528.

\* cited by examiner

LATERALLY COUPLED BAW FILTER EMPLOYING PHONONIC CRYSTALS

CROSS-REFERENCE TO RELATED APPLICATIONS

This application is a National Stage of International patent application PCT/EP2011/067654, filed on Oct. 10, 2011, which claims priority to foreign French patent application No. FR 1058403, filed on Oct. 15, 2010, the disclosures of which are incorporated by reference in their entirety.

FIELD OF THE INVENTION

The field of the invention is that of electromechanical devices which make use of the propagation of acoustic waves in piezoelectric films to provide electrical filter functions.

BACKGROUND

Devices of this type have operating frequencies ranging from several hundred MHz to several GHz, and are used in radio-frequency transmission circuits (mobile telephones, radio links, wireless data exchange, etc.), signal processing circuits, and sensor systems.

Most acoustic filters currently produced using BAW (Bulk Acoustic Wave) resonators are electrically coupled. However, some functions requiring electrical insulation between the input and output of the filter are still difficult to provide: they require the use of a balun, which is a costly arrangement in terms of overall dimensions and electrical losses. This drawback can be avoided by using acoustic coupling. In view of this situation, CRFs (Coupled Resonator Filters) such as those shown in FIG. 1 have been developed, as described in the following papers: G. G. Fattinger, J. Kaitila, R. Aigner and W. Nessler, *Single-to-balanced Filters for Mobile Phones using Coupled Resonator BAW Technology*, 2004 IEEE Ultrasonics Symposium, pp. 416-419, and J. D. Larson and R. C. Ruby, *Thin-film acoustically-coupled transformer*, U.S. Pat. No. 6,946,928 B2, September 2005. More precisely, a substrate S includes a stack of films in which the following are defined:

a Bragg mirror structure $MR_1$;
a film of first piezoelectric material $P_{iézo1}$ inserted between a first lower electrode $E_{i1}$ and a first upper electrode $E_{s1}$;
a second Bragg mirror structure $MR_2$; and
a film of second piezoelectric material $P_{iézo2}$ inserted between a second lower electrode $E_{i2}$ and a second upper electrode $E_{s2}$.

These structures enable this requirement to be met by limiting the necessary surface area and the losses, but the technology required for their manufacture is highly complicated, as described in C. Billard, N. Buffet, A. Reinhardt, G. Parat, S. Joblot and P. Bar, 200 *mm Manufacturing Solution for Coupled Resonator Filters*, Proceedings of the 39th European Solid-State Device Research Conference (ESSDERC 2009), pp. 133-136.

In the field of acoustic filters, notably that of what are known as monolithic filters constructed on quartz piezoelectric material, the use of lateral coupling between resonators has already been proposed, with the resonators placed side by side as shown in FIG. 2. The piezoelectric material $P_{iézo}$ is inserted between two sets of upper and lower electrodes, indicated respectively by $E_{s1}$, $E_{i1}$ and $E_{s2}$, $E_{i2}$. Thickness shear (TS) waves are then excited, these waves being naturally evanescent outside the resonators, and by varying the distance between the resonators it is possible to vary the energy transmitted and thus modify the width of the pass band of the filter. In this case, the filter is known as a lateral coupling filter or monolithic filter. This works well for filters constructed on a piezoelectric substrate (notably quartz), but these resonators have a low resonant frequency (no more than a few hundred megahertz), owing to their considerable thickness, and they are not compatible with CMOS technologies (for mobile telephony, for example).

When these filters are transferred to thin films, with a thickness of the order of a millimeter, as described in J. Meltaus, T. Pensala, K. Kokkonen and A. Jansman, *Laterally coupled solidly mounted BAW resonators at 1.9 GHz*, 2009 Ultrasonics Symposium Proceedings, CMOS-compatible piezoelectric materials are used, for example aluminum nitride (AlN) or zinc oxide (ZnO). However, these materials naturally have acoustic characteristics such that the waves propagated therein are not necessarily evanescent outside the resonators. A structure such as that of FIG. 2 therefore produces very strongly coupled resonators, regardless of the distance between them, resulting in behavior identical to that of a single resonator.

However, the acoustic behavior of the stack can be modified by adding other materials to the stack, or by using the perturbation effect created by a Bragg mirror, thus restoring propagation conditions similar to those found naturally in quartz, as described in G. G. Fattinger, S. Marksteiner, J. Kaitila and R. Aigner, *Optimization of acoustic dispersion for high performance thin-film BAW resonators*, 2005 IEEE Ultrasonics Symposium Proceedings, pp. 1175-1178.

This is the solution which is described, for example, in J. Meltaus, T. Pensala, K. Kokkonen and A. Jansman, *Laterally coupled solidly mounted BAW resonators at 1.9 GHz*, 2009 Ultrasonics Symposium Proceedings.

In this case, the distance between two laterally coupled resonators, corresponding to the evanescence length, is very small, being typically of the same order of magnitude as the thickness of the film. It then becomes difficult to achieve precise control of the distance between the resonators, and consequently the coupling, which has a direct effect on the width of the filter pass band.

SUMMARY OF THE INVENTION

In this context, the present invention proposes a laterally coupled filter solution using a piezoelectric material which does not necessarily intrinsically satisfy the evanescence conditions for the waves, by introducing phononic crystals which can be used to reduce the transmission coefficient of laterally propagating elastic waves. It should be noted that a phononic crystal is a periodic arrangement of a plurality of acoustically different materials, causing a modification of the propagation conditions of acoustic waves. Certain arrangements of materials may lead to the appearance of stop bands, which are frequency ranges in which no acoustic wave propagates. In concrete terms, this means that the attenuation of a wave penetrating into this crystal will increase with the degree of its penetration into this structure; it is this phenomenon that is used in the present invention in order to modulate the propagation of lateral acoustic waves within bulk acoustic wave filters.

More specifically, the present invention proposes an acoustic wave bandpass filter comprising at least two bulk acoustic wave resonators which are laterally coupled to each other acoustically, each resonator including a film of piezoelectric material and at least a first electrode and/or a second electrode, said bulk waves propagating in a direction perpendicular to the plane of the film of piezoelectric material, characterized in that:

it further comprises at least a first phononic crystal structure between said resonators such that the transmission coefficient of the lateral acoustic waves can be decreased in a direction parallel to the plane of the piezoelectric film; and the first phononic crystal structure is formed in a matrix of dielectric material or with patterns made from dielectric material.

Thus, advantageously, electrically insulating components are used rather than metallic components such as phononic crystals formed on the basis of metallic patterns to create electrically localized networks of conducting components between the input and output of the filter, which have the effect of short-circuiting the input and output of the filter and thus reducing the filter's effect of injecting undesired frequencies.

In a variant of the invention, the phononic crystal structure is located in the film of piezoelectric material.

In a variant of the invention, the resonators are formed by a stack of films, and the phononic crystal structure includes patterns on the surface of the stack and/or under said stack and/or in at least one film of said stack.

In a variant of the invention, the patterns of the phononic structure are made of $SiO_2$ or SiN or Mo or W or AlN.

In a variant of the invention, the phononic crystal structure is one-dimensional.

In a variant of the invention, the phononic crystal structure is two-dimensional.

In a variant of the invention, the phononic crystal structure is three-dimensional.

In a variant of the invention, the piezoelectric material is made from AlN.

In a variant of the invention, the piezoelectric material is made from $LiNbO_3$.

In a variant of the invention, the phononic crystal structure has inclusions and/or diffused species.

These inclusions are produced, notably, by atomic implantation or by diffusion of chemical species.

In a variant of the invention, the inclusions are produced by the implantation of hydrogen atoms.

In a variant of the invention, the phononic crystal structure contains holes.

In a variant of the invention, the filter further comprises second phononic crystal structures at the periphery of said resonators, which have attenuation coefficients for the acoustic waves known as lateral waves which are greater than the attenuation coefficients of the first phononic crystal structures located between said resonators.

In a variant of the invention, the resonators each comprise an upper electrode and a lower electrode.

In a variant of the invention, the resonators each comprise a pair of electrodes positioned at the surface of the piezoelectric material.

In a variant of the invention, the filter further comprises an acoustic structure for isolating the filter acoustically, this structure being a Bragg mirror and/or a cavity and/or a third phononic crystal structure.

More generally, in order to form a phononic crystal, the invention may use any method by which:

atoms are implanted into a piezoelectric material so as to form either a new material (new phase) or said material having inclusions whose dimensions are smaller than the propagation wavelength in said material; or a method is used which causes the diffusion of chemical species in the material, also causing the formation of a new material.

Similarly, the Bragg mirror can be produced by implanting atoms into the piezoelectric material so as to form either a new material or said material having inclusions whose dimensions are smaller than the propagation wavelength in said material.

BRIEF DESCRIPTION OF THE DRAWINGS

The invention will be more clearly understood and other advantages will become apparent in the light of the non-limiting description which is given below and with the aid of the attached drawings, in which.

DETAILED DESCRIPTION

According to the present invention, the filter includes a BAW stack in which propagation of the lateral acoustic waves takes place. The evanescence of the lateral waves is induced by inserting at least one phononic crystal into the space between two resonators. The evanescence of the laterally propagating modes is determined according to calculations such as those described in V. Laude, B. Aoubiza, Y. Achaoui, S. Benchabane and A. Khélif, *Band structure of evanescent waves in phononic crystals*, 2008 IEEE Ultrasonics Symposium Proceedings, pp. 249-252. If the evanescence of the lateral waves is known, it is possible to determine the number of periods of the phononic crystal required to provide a lateral coupling filter having desired characteristics (notably in terms of the pass band).

A 1D, 2D or 3D phononic crystal may equally well be used in this case, provided that it limits the propagation of the lateral waves. The phononic crystal must be made of at least two acoustically different materials, which may be air, the piezoelectric material used for the film, or any other solid or fluid.

A phononic crystal can be added between the resonators in the case of BAW resonators on Bragg mirrors or membranes, or in the case of HBARs (High Overtone Bulk Acoustic Resonators).

Figure 1:
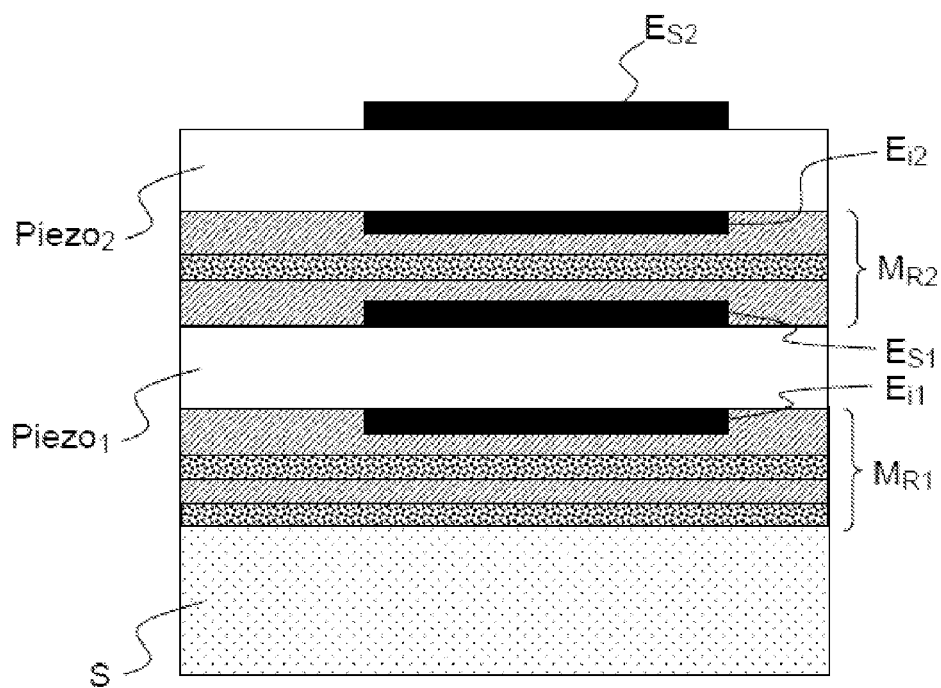
FIG. 1 shows a filter structure according to the prior art, comprising resonators coupled to bulk waves, using Bragg mirror structures.
Figure 2:
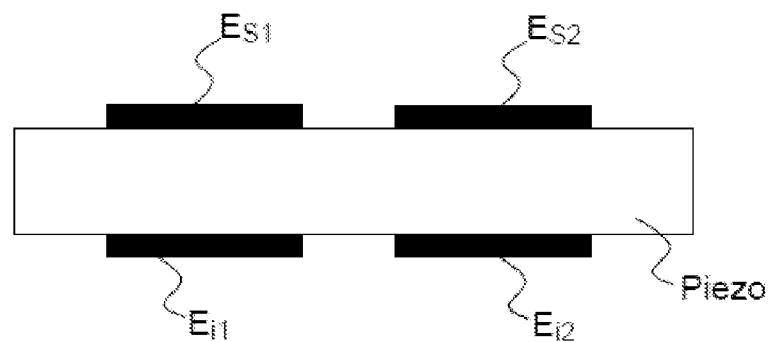
FIG. 2 shows two resonators using lateral coupling in a material such as quartz according to the prior art.
Figure 3:
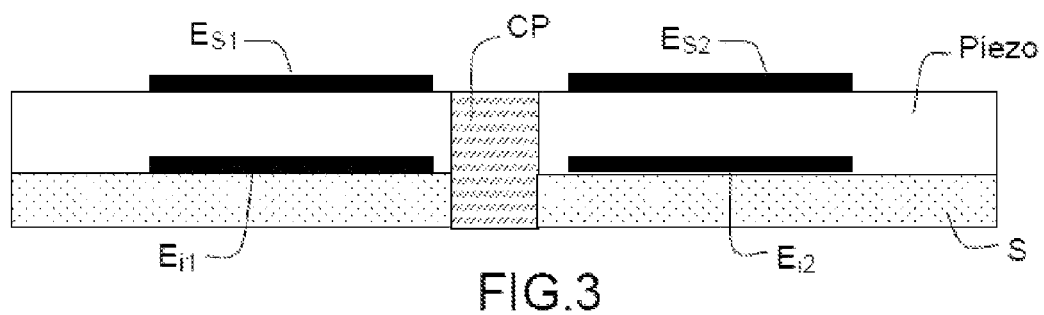
FIG. 3 shows a variant filter according to the invention using a phononic crystal so as to optimize the lateral waves between the bulk wave resonators.
Figure 4:
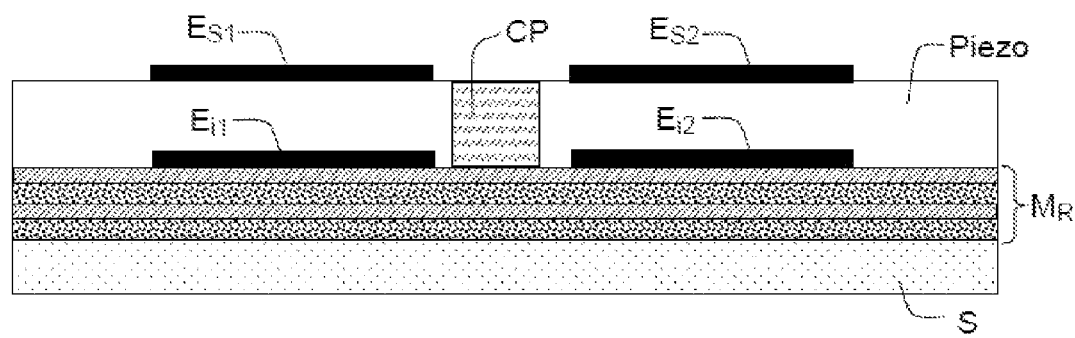
FIG. 4 shows a variant filter of the SMR type according to the invention using a phononic crystal so as to optimize the lateral waves between the bulk wave resonators.
Figure 5:
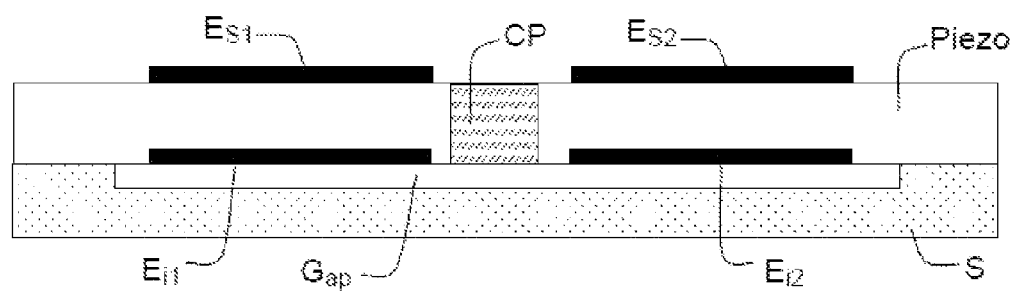
FIG. 5 shows a variant FBAR filter according to the invention using a phononic crystal so as to optimize the lateral waves between the bulk wave resonators.

In this context, FIGS. 3, 4 and 5 show, respectively, configurations of filters using resonators of the SMR (Solidly Mounted Resonator) type, with a Bragg mirror structure, and filters using resonators of the FBAR (Film Bulk Acoustic Resonator) type, including a central region having a phononic crystal CP, between the two bulk wave resonators formed respectively with the electrode pairs $E_{s1}$, $E_{i1}$ and $E_{s2}$, $E_{i2}$ and the piezoelectric material $P_{iézo}$, formed on the surface of a substrate S, while, in the case of the FBAR resonator filter, a gap $G_{ap}$ separates the membrane formed in the piezoelectric material from the substrate.

Exemplary Embodiment of a Filter According to the Invention Comprising a One-Dimensional Phononic Crystal Formed on the Surface The filter comprises a film of AlN piezoelectric material which has a thickness which may typically be of the order of 1 μm and may form part of a membrane separated from the substrate (not shown) by an air gap.

Figure 6A:
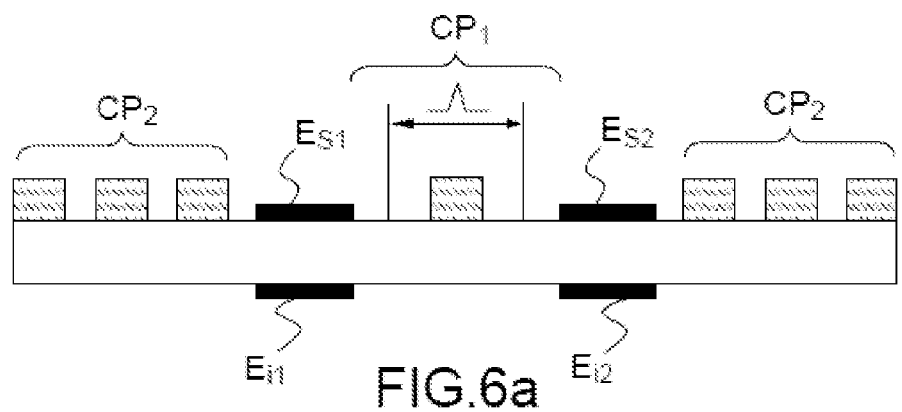
FIGS. 6a and 6b show, respectively, a cross-sectional view and a top view of a variant filter according to the invention which further includes peripheral regions having phononic crystals to diminish the lateral waves at the periphery.

According to this example, the central phononic crystal structure $CP_1$ is formed by a central line produced on the surface of the piezoelectric material, centered between the sets of electrodes $E_{s1}$, $E_{i1}$ and $E_{s2}$, $E_{i2}$ of the two coupled resonators and thus defining a period Λ of said phononic crystal structure, as shown in FIG. 6a.

Figure 6B:
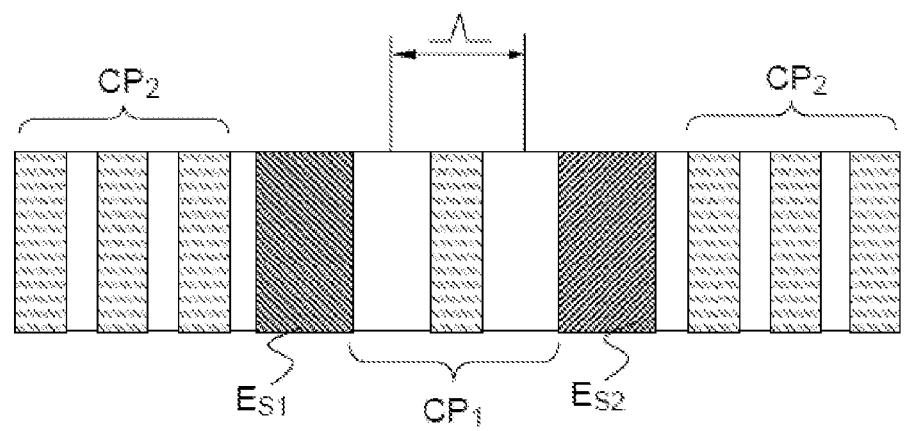

The resonators are made with molybdenum electrodes whose typical thickness may be of the order of 200 nm, for a surface area of 50×300 μm². The filter comprises a set of silicon dioxide ($SiO_2$) lines, deposited on a film of AlN, with a thickness of 500 nm and a width of 15 μm. A line of $SiO_2$ is placed between the resonators so as to form a first phononic crystal $CP_1$ and the filter is isolated at its periphery by three lines on each side, forming second phononic crystals $CP_2$, as shown in FIGS. 6a and 6b.

Figure 7:
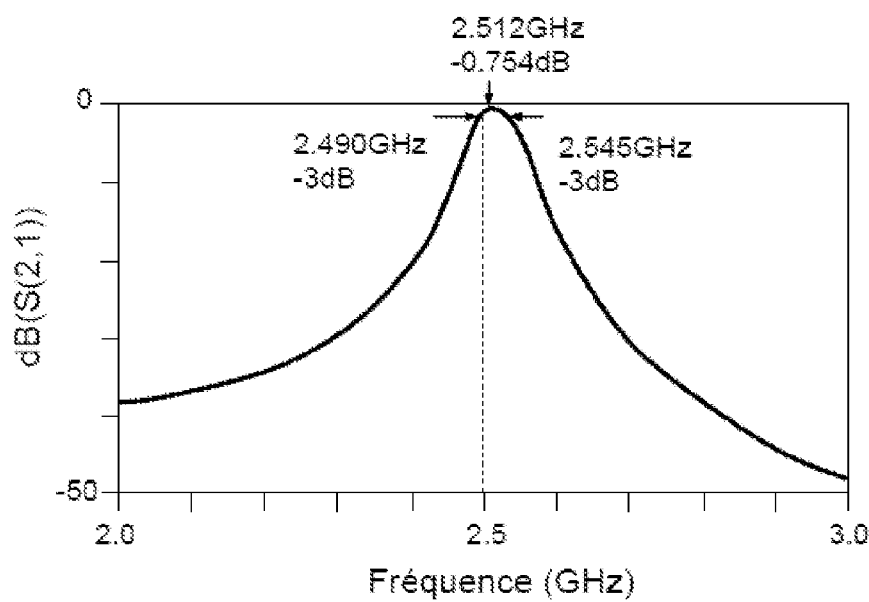
FIG. 7 shows the electrical performance of a filter according to the invention.

FIG. 7 shows the transmission in dB as a function of frequency obtained with the filter described above. A −3 dB pass band is obtained at 55 MHz and is centered on 2.51 GHz.

Exemplary Embodiment of a Filter According to the Invention Comprising FBAR Resonators (Such as Those Described By N. K. Kuo, C. J. Zuo, G. Piazza, Demonstration of Inverse Acoustic Band Gap Structures in AlN and Integration with Piezoelectric Contour Mode Wideband Transducers, 2009 IEEE Solid-State-Sensors, Actuators and Microsystems Symposium, pp 10-13, 2009) and a Phononic Crystal Formed by Etching the Film of Piezoelectric Material FIGS. 8a to 8e show different steps of an exemplary method for manufacturing an FBAR resonator filter such as that shown in FIG. 5, in which the phononic crystal is formed by etching the film of piezoelectric material.

Figure 8A:
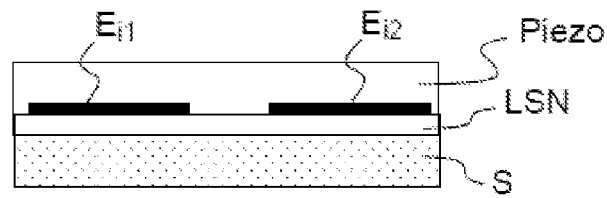
FIGS. 8a to 8e show the steps of a method for manufacturing an exemplary FBAR resonator filter according to the invention.

FIG. 8a shows the first step of the method, starting with a silicon substrate S, typically with a thickness of approximately 700 μm, on which an LSN (Low Stress Nitride) film with a thickness of approximately 300 nm is deposited. A platinum (Pt) film with a thickness of 200 nm is then deposited, and a step of lift-off lithography is carried out on said film so as to form the two lower electrodes $E_{i1}$ and $E_{i2}$; finally, a film of piezoelectric material $P_{iezo}$ made of aluminum nitride (AlN) with a thickness of approximately 2 μm is deposited.

Figure 8B:
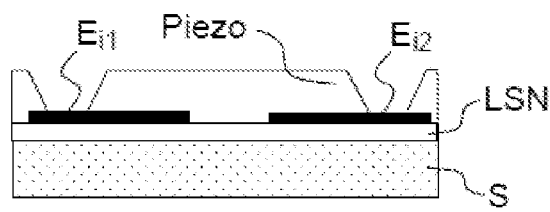

FIG. 8b shows a step of wet KOH etching of the AlN for providing access points to the lower electrodes $E_{i1}$ and $E_{i2}$.

Figure 8C:
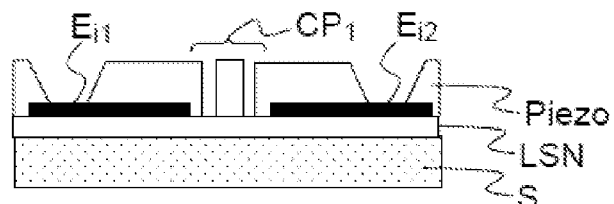

FIG. 8c shows a step of dry etching of the AlN for forming the phononic crystal $CP_1$.

Figure 8D:
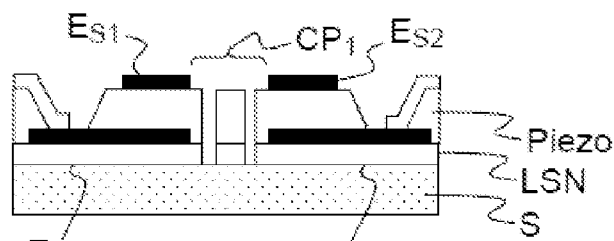

FIG. 8d shows the deposition of a platinum film intended for the formation of the upper electrodes $E_{s1}$, $E_{s2}$ with a thickness of approximately 200 nm by lithography of the platinum film and by using the lift-off method.

Figure 8E:
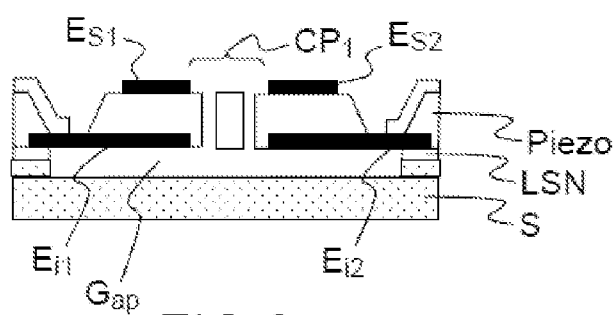

FIG. 8e shows the use of xenon difluoride $XeF_2$ to release the membrane, which is isolated from the substrate by an air gap $G_{ap}$.

Figure 9:
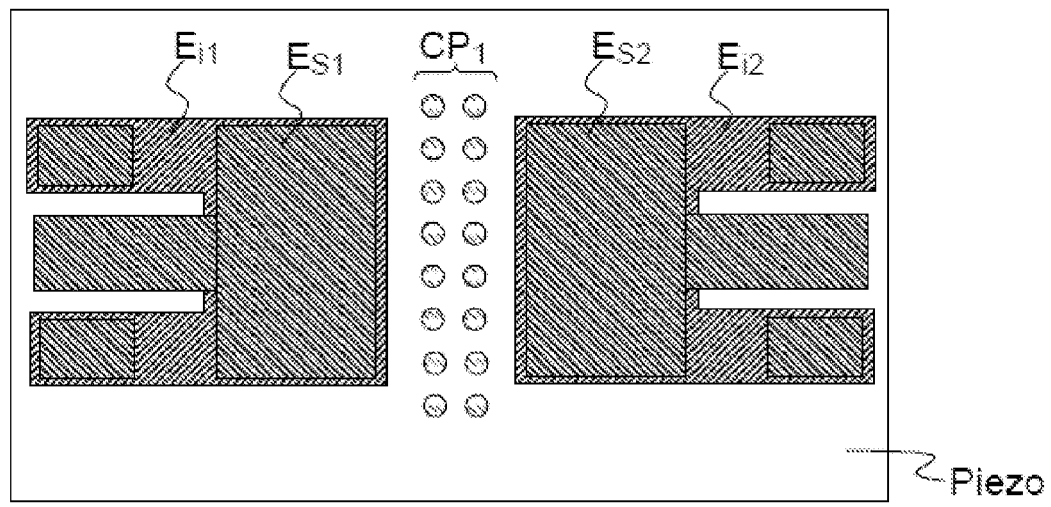
FIG. 9 shows a top view of the exemplary FBAR resonator filter made according to the steps shown in FIGS. 8a to 8e.

FIG. 9 shows a top view of the exemplary filter made by the method whose steps are shown in FIGS. 8a to 8e.

Exemplary Embodiment of a Filter According to the Invention Comprising SMR Resonators and a Phononic Crystal Formed on the Surface of the Film of Piezoelectric Material FIGS. 10a to 10d show different steps of an exemplary method for manufacturing a filter with SMR resonators separated by a phononic crystal formed by lines of silica positioned in the space between the resonators, above the film of piezoelectric material.

It should be noted that it may be equally feasible to form the phononic crystal structure above and/or advantageously both above and below the piezoelectric film.

Figure 10A:
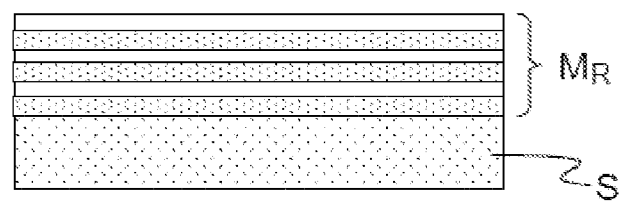
FIGS. 10a to 10d show the steps of a method for manufacturing an SMR resonator filter according to the invention.

As shown in FIG. 10a, starting with a silicon substrate S, an operation of thermal oxidation of said $SiO_2$ substrate is carried out over a thickness of 1 μm, after which successive depositions of the following components are made:
  silicon nitride (SiN) over a thickness of about 0.8 μm;
  silicon oxycarbide, SiOC, over a thickness of about 1 μm;
  SiN over a thickness of about 0.5 μm;
  SiOC over a thickness of about 1 μm;
  SiN over a thickness of about 0.5 μm, and
  $SiO_2$ over a thickness of about 0.6 μm so as to form a Bragg mirror structure MR.

Figure 10B:
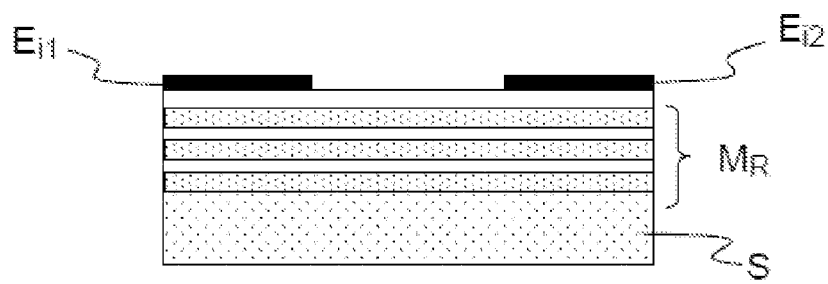

FIG. 10b shows the formation of the two lower electrodes $E_{i1}$ and $E_{i2}$ by the deposition of a film of molybdenum (Mo) over a thickness of 0.3 μm, followed by lithography, etching, and removal of the etching mask.

Figure 10C:
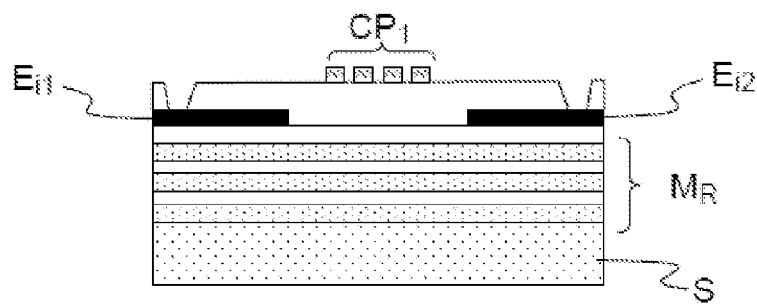

FIG. 10c shows the formation of the phononic crystal by the following successive operations:
  deposition of the film of AlN piezoelectric material over a thickness of 1.7 μm;
  deposition of an $SiO_2$ film with a thickness of about 0.5 μm for forming a phononic crystal $CP_1$, followed by a step of lithography, etching and local removal of the $SiO_2$ film;
  etching and local removal of the AlN film to reveal the contact points.

Figure 10D:
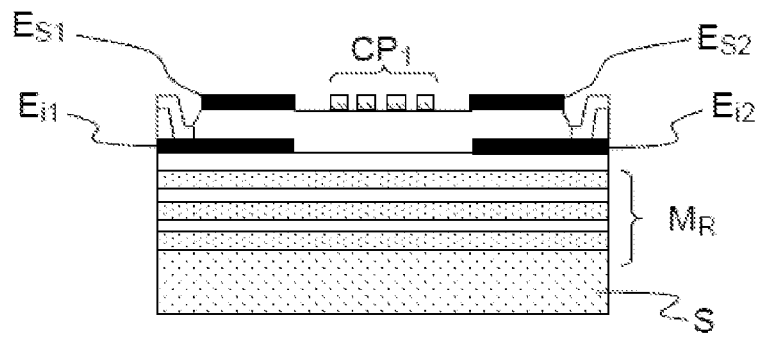

FIG. 10d shows the formation of the upper electrodes $E_{s1}$ and $E_{s2}$ by the deposition of a film of molybdenum (Mo) over a thickness of 0.3 μm, followed by lithography, etching, and removal of the etching mask.

Thus four levels of masks are required. The phononic crystal could also be formed from molybdenum lines to avoid some steps of the process, but there may be a risk of electrical coupling between the metallic lines and the resonators.

Figure 11:
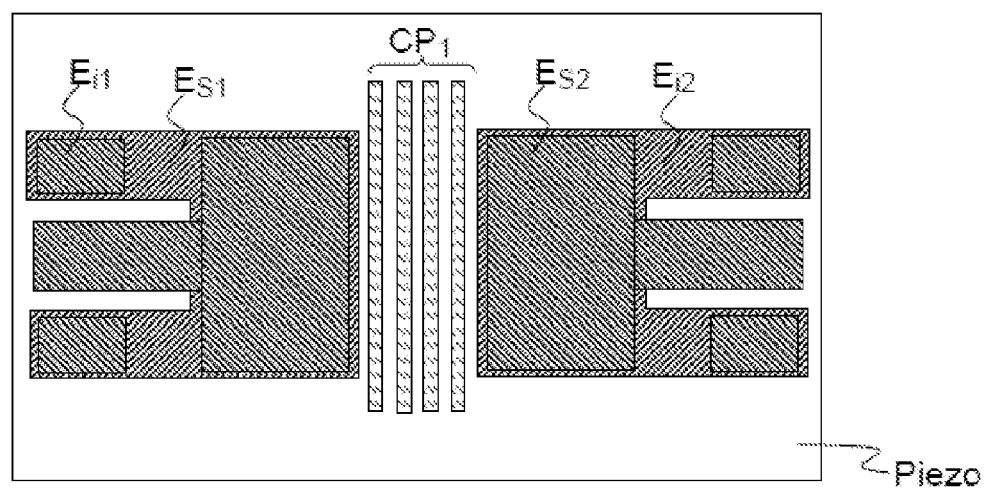
FIG. 11 shows a top view of the exemplary SMR resonator filter made according to the steps shown in FIGS. 10a to 10d.

FIG. 11 shows a top view of the exemplary filter made by the method whose steps are illustrated above, with the lower and upper contact points of the electrodes.

Exemplary Embodiment of a Filter According to the Invention Comprising SMR Resonators and a 2D Phononic Crystal, All Formed in the Surface of the Film of Piezoelectric Material The filter is composed of SMR resonators and 2D phononic crystal structures.

The two-dimensional structure forming the phononic crystal is produced in a lithium niobate piezoelectric substrate by what is known as a proton exchange method, consisting in the formation of areas in which the original lithium niobate is chemically converted to niobic acid ($HNbO_3$) or a compound of the $Li_xH_{1-x}NbO_3$ type, as described for example in J. L. Jackel, C. E. Rice and J. J. Veselka, *Proton exchange for high-index waveguides in LiNbO3*, Applied Physics Letters vol. 41, no. 7, pp. 607-608 (1982). The acoustic properties of this material are substantially different from those of the original lithium niobate, and therefore the two-dimensional structure has phononic crystal properties.

The Bragg mirror which isolates the structure from the substrate is also formed from films of $Li_xH_{1-x}NbO_3$, which are also created by a proton exchange reaction, but in this case by implantation of hydrogen into the lithium niobate, to form completely buried inclusions (which are not close to the surface). The process steps required for production are as follows, and are illustrated in the drawings identified below.

Figure 12A:
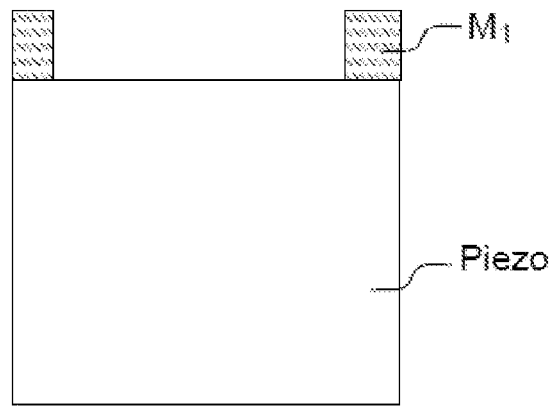
FIGS. 12a to 12f show the steps of a method for manufacturing an exemplary filter according to the invention comprising SMR resonators and a 2D phononic crystal formed in the film of piezoelectric material.

As illustrated in FIG. 12a, a piezoelectric substrate $P_{iézo}$ of lithium niobate is cleaned, and a photolithographic operation is then carried out to form a first mask $M_1$ covering the implanted areas.

Figure 12B:
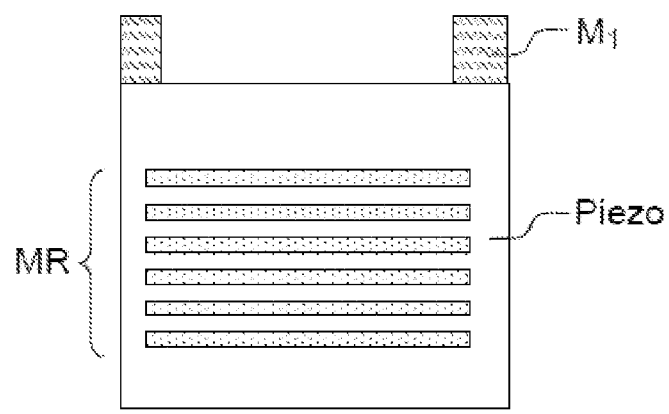

Successive hydrogen implantation operations are then carried out, in decreasing order of energy, so as to form a periodic implantation profile which constitutes the Bragg mirror MR, as illustrated in FIG. 12b.

Figure 12C:
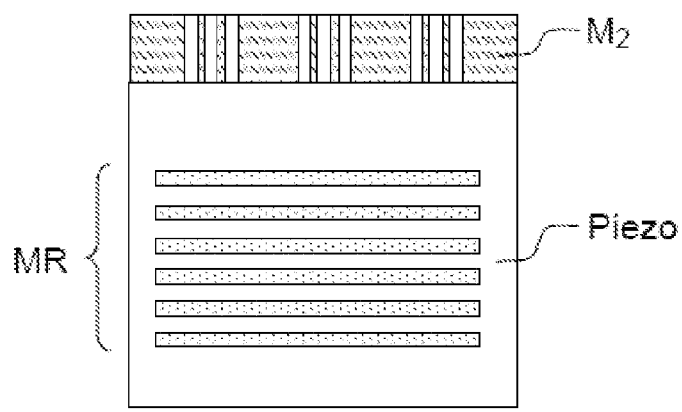

The resin mask is then removed by a further photolithography operation to form the second mask $M_2$ for the proton exchange as illustrated in FIG. 12c.

Figure 12D:
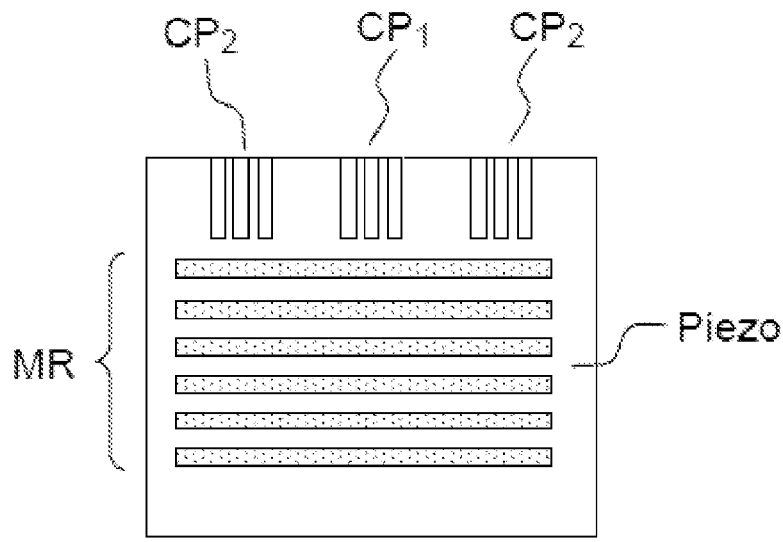

The proton exchange is then carried out by immersion in a bath of molten benzoic acid ($C_6H_5COOH$) (at a temperature of more than 249° C.). This is followed by rinsing with alcohol. The resin is removed as illustrated in FIG. 12d, allowing the phononic crystal structures $CP_1$ and $CP_2$ to be formed.

Figure 12E:
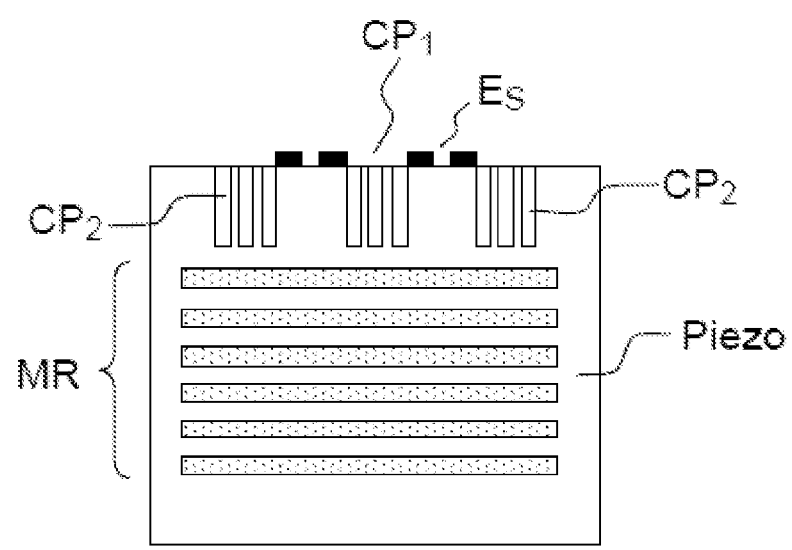

The operations of deposition, photolithography, etching, and resin removal are then carried out, for the purpose of forming the upper electrodes $E_s$, from aluminum for example, as shown in FIG. 12e.

In this variant, each resonator includes a pair of upper electrodes $E_s$ on the surface of the piezoelectric material, the electrodes in each pair being very close to each other, being typically separated by less than a few microns, the acoustic waves being propagated in the volume of the piezoelectric material as before, but being generated by an electric field parallel to the plane of said material.

Figure 12F:
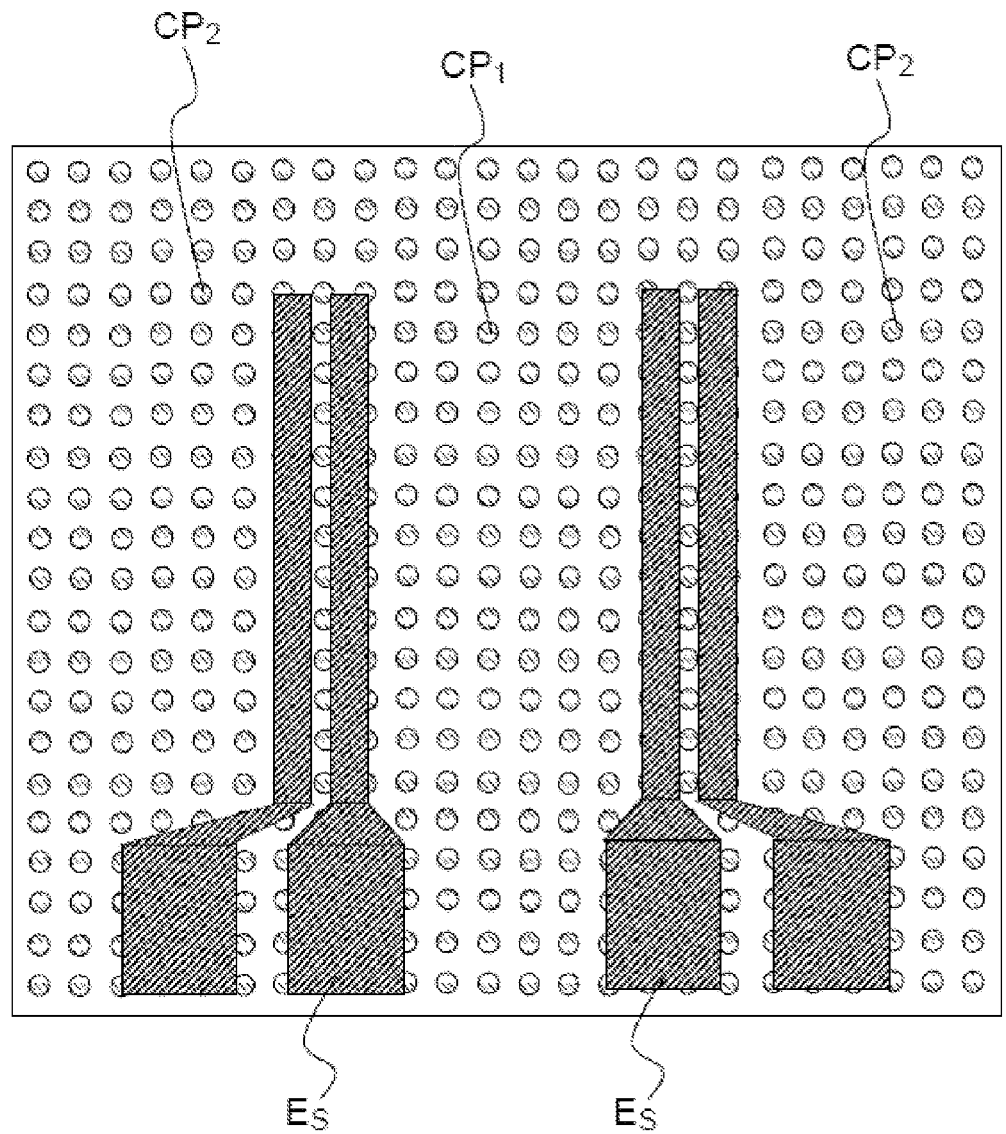

FIG. 12f shows a top view of the exemplary filter made by the method whose steps were described above.

Exemplary Embodiment of a Filter According to the Invention Comprising SMR Resonators and a 3D Phononic Crystal, All Formed in the Film of Piezoelectric Material The filter is composed of SMR resonators and 3D phononic crystal structures, made by locally implanting hydrogen into a lithium niobate ($LiNbO_3$) substrate. The process steps required for production are as follows, and are illustrated in FIGS. 13a to 13c.

In this variant, each resonator includes a pair of upper electrodes $E_s$ on the surface of the piezoelectric material, the electrodes in each pair being very close to each other, being typically separated by less than a few microns, the acoustic waves being propagated in the volume of the piezoelectric material as before, but being generated by an electric field parallel to the plane of said material.

Figure 13A:
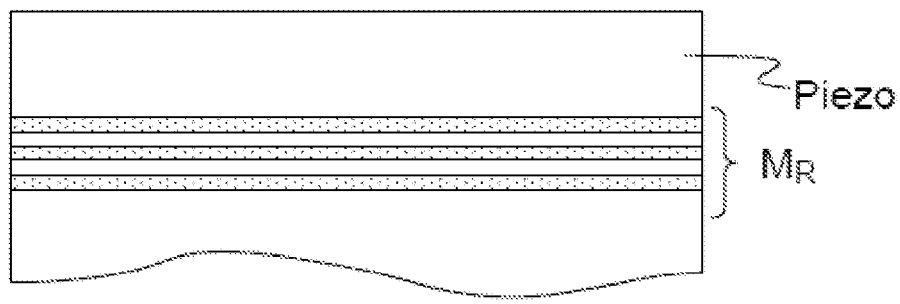
FIGS. 13a to 13c show the steps of a method for manufacturing an exemplary SMR resonator filter including an implanted Bragg mirror structure and 3D phononic crystal structures within a substrate of piezoelectric material.

FIG. 13a shows the successive operations of hydrogen implantation into a substrate $P_{iezo}$ of lithium niobate ($LiNbO_3$) to form films of $Li_xH_{1-x}NbO_3$, thus producing a Bragg mirror structure MR.

Figure 13B:
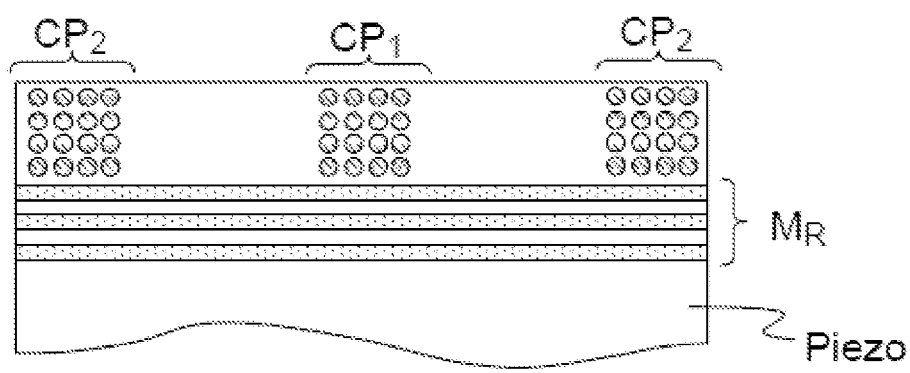
Figure 13C:
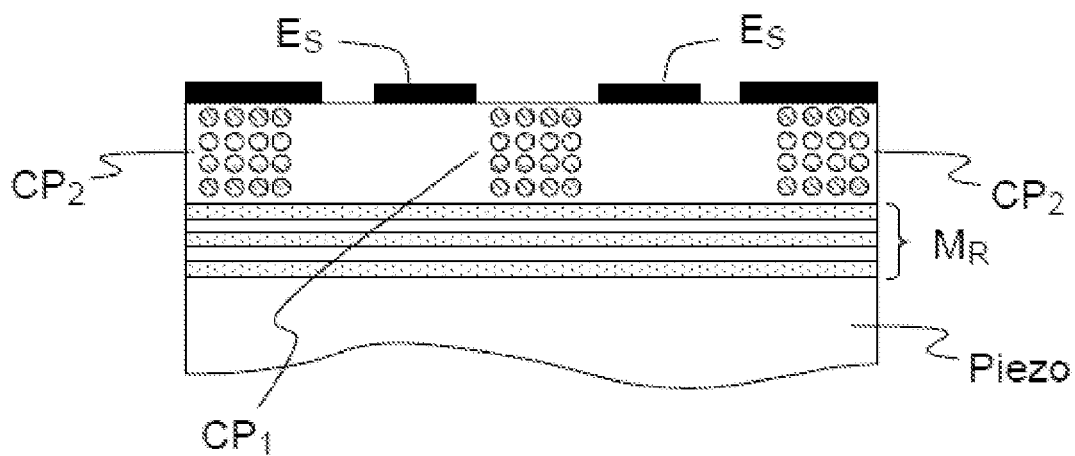

FIG. 13b shows the production of phononic crystal structures $CP_1$ and $CP_2$ made by masking and successive hydrogen implantations with different thicknesses, followed by the removal of the mask, which is not shown.

FIG. 13c shows the production of the upper electrodes $E_s$, together with the contact points, by means of deposition, lithography, etching, and removal of an upper film of aluminum.

The invention claimed is:

1. An acoustic wave bandpass filter comprising:
   at least two bulk acoustic wave resonators, laterally coupled to each other acoustically, each of the at least two bulk acoustic resonators including a film of piezoelectric material and at least one of a first electrode and a second electrode, wherein the at least two bulk acoustic wave resonators are configured to propagate bulk waves in a direction perpendicular to a plane of the film of piezoelectric material; and
   at least one first phononic crystal structure having a periodic arrangement of a plurality of materials which are acoustically different from each other, causing stop bands, wherein the stop bands are frequency ranges in which no acoustic wave propagates, wherein the at least one first phononic crystal structure is located between said at least two bulk acoustic wave resonators such that a transmission coefficient of the bulk waves can be decreased in a direction parallel to the plane of the film of piezoelectric material,
   wherein the at least one first phononic crystal structure is formed in a matrix of dielectric material or with patterns made from dielectric material.

2. The acoustic wave bandpass filter as claimed in claim 1, wherein the at least one first phononic crystal structure is located in the film of piezoelectric material.

3. The acoustic wave bandpass filter as claimed in claim 1, wherein the at least two bulk acoustic wave resonators are formed by a stack of films, and the at least one first phononic crystal structure includes the patterns made from dielectric material on a surface of the stack and/or under said stack and/or in at least one film of said stack.

4. The acoustic wave bandpass filter as claimed in claim 3, wherein the dielectric material comprises at least one of $SiO_2$, SiN, Mo, W, and AlN.

5. The acoustic wave bandpass filter as claimed in claim 1, wherein the at least one first phononic crystal structure is one-dimensional.

6. The acoustic wave bandpass filter as claimed in claim 1, wherein the at least one first phononic crystal structure is two-dimensional.

7. The acoustic wave bandpass filter as claimed in claim 1, wherein the at least one first phononic crystal structure is three-dimensional.

8. The acoustic wave bandpass filter as claimed in claim 1, wherein the piezoelectric material is made of AlN.

9. The acoustic wave bandpass filter as claimed in claim 1, wherein the piezoelectric material is made of $LiNbO_3$.

10. The acoustic wave bandpass filter as claimed in claim 1, wherein the at least one first phononic crystal structure has inclusions and/or diffused species.

11. The acoustic wave bandpass filter as claimed in claim 10, wherein the inclusions are produced by implantation of hydrogen atoms.

12. The acoustic wave bandpass filter as claimed in claim 1, wherein the at least one first phononic crystal structure includes holes.

13. The acoustic wave bandpass filter as claimed in claim 1, further comprising second phononic crystal structures at the periphery of said at least two bulk acoustic wave resonators, wherein the second phononic crystal structures have attenuation coefficients for the bulk waves known as lateral waves which are greater than attenuation coefficients of the at least one first phononic crystal structure structures located between said at least two resonators.

14. The acoustic wave bandpass filter as claimed in claim 1, wherein the at least two resonators each comprise an upper electrode and a lower electrode.

15. The acoustic wave bandpass filter as claimed in claim 1, wherein at least one of the at least two bulk acoustic resonators comprises the first electrode and the second electrode wherein the first and second electrodes are positioned on a surface of the film of piezoelectric material.

16. The acoustic wave bandpass filter as claimed in claim 1, further comprising an acoustic structure for isolating the filter acoustically, this structure being a Bragg mirror and/or a cavity and/or a third phononic crystal structure.

* * * * *

UNITED STATES PATENT AND TRADEMARK OFFICE
CERTIFICATE OF CORRECTION

PATENT NO. : 9,325,293 B2
APPLICATION NO. : 13/879406
DATED : April 26, 2016
INVENTOR(S) : Marie Gorisse et al.

Page 1 of 1

It is certified that error appears in the above-identified patent and that said Letters Patent is hereby corrected as shown below:

On the title page

In the Assignee name, please replace "Energies Alternatives" with --Commissariat A L'Energie Atomique et aux Energies Alternatives--.

Signed and Sealed this
Twenty-first Day of June, 2016

Michelle K. Lee
*Director of the United States Patent and Trademark Office*